United States Patent
Pintado et al.

(10) Patent No.: US 10,945,213 B2
(45) Date of Patent: Mar. 9, 2021

(54) DYNAMIC BATTERY POWER MANAGEMENT

(71) Applicant: Google LLC, Mountain View, CA (US)

(72) Inventors: Enrique Romero Pintado, Campbell, CA (US); Liang Jia, Palo Alto, CA (US); Srikanth Lakshmikanthan, Milpitas, CA (US); Eklavya Singh, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/351,639

(22) Filed: Mar. 13, 2019

(65) Prior Publication Data

US 2019/0281556 A1 Sep. 12, 2019

Related U.S. Application Data

(63) Continuation of application No. 15/692,546, filed on Aug. 31, 2017, now Pat. No. 10,237,830.

(51) Int. Cl.
*H04W 52/02* (2009.01)
*H02J 7/00* (2006.01)
(Continued)

(52) U.S. Cl.
CPC .......... *H04W 52/0261* (2013.01); *H02J 7/00* (2013.01); *G01R 31/36* (2013.01); *G01R 31/389* (2019.01); *H02J 2007/0067* (2013.01)

(58) Field of Classification Search
CPC .......... H04W 52/0261; H04W 52/367; H04W 52/0251
See application file for complete search history.

(56) References Cited

U.S. PATENT DOCUMENTS 5,969,508 A 10/1999 Patino et al.
6,789,026 B2 9/2004 Barsoukov et al.
(Continued)

FOREIGN PATENT DOCUMENTS

CN 102195304 9/2011
CN 102576914 7/2012
(Continued)

OTHER PUBLICATIONS

'batteryuniversity.com' [online] "BU-602: How does a Battery Fuel Gauge Work?," Jul. 28, 2016, [retrieved on Aug. 31, 2017] Retrieved from Internet: URL<http://batteryuniversity.com/learn/article/the_battery_fuel_gauge> 9 pages.

(Continued)

*Primary Examiner* — Keith Ferguson
(74) *Attorney, Agent, or Firm* — Fish & Richardson P.C.

(57) ABSTRACT

Methods, systems, and devices, including machine-readable media, for dynamic battery power management are disclosed. In some implementations, an electronic device that is powered by a battery senses a voltage provided by the battery and an electric current provided by the battery. The electronic device determines a present state of the battery. The electronic device determines a current limit for the electronic device based on the sensed voltage and electric current and the determined present state of the battery. The electronic device manages power use of the electronic device to maintain electric current draw from the battery at or below the electric current limit.

20 Claims, 6 Drawing Sheets

(51) Int. Cl.
*G01R 31/389* (2019.01)
*G01R 31/36* (2020.01)

(56) References Cited

U.S. PATENT DOCUMENTS

| | | | |
|---|---|---|---|
| 6,832,171 | B2 | 12/2004 | Barsoukov et al. |
| 6,892,148 | B2 | 5/2005 | Barsoukov et al. |
| 7,990,106 | B2 | 8/2011 | Hussain |
| 8,552,691 | B2 | 10/2013 | Wu |
| 8,604,753 | B2 | 12/2013 | Bessa et al. |
| 8,653,796 | B2 | 2/2014 | Tam |
| 9,653,759 | B2 | 5/2017 | Coates |
| 1,003,320 | A1 | 7/2018 | Huang et al. |
| 2004/0128089 | A1* | 7/2004 | Barsoukov ........... G01R 31/389 702/65 |
| 2005/0110498 | A1 | 5/2005 | Plett |
| 2008/0054855 | A1 | 3/2008 | Hussain |
| 2009/0212626 | A1 | 8/2009 | Snyder et al. |
| 2010/0174499 | A1 | 7/2010 | Kang |
| 2012/0256569 | A1 | 10/2012 | Kawahara et al. |
| 2013/0063097 | A1 | 3/2013 | Valentine |
| 2013/0307334 | A1 | 11/2013 | Middleton et al. |
| 2014/0167842 | A1 | 6/2014 | Chen et al. |
| 2015/0037624 | A1 | 2/2015 | Thompson |
| 2016/0231801 | A1 | 8/2016 | Chandra et al. |
| 2017/0070063 | A1* | 3/2017 | Chhaya ................. H02J 7/0078 |
| 2017/0093176 | A1 | 3/2017 | Harmke |
| 2018/0278075 | A1* | 9/2018 | Pawar ................... G06F 1/3212 |

FOREIGN PATENT DOCUMENTS

| | | |
|---|---|---|
| CN | 103872746 | 6/2014 |
| CN | 104765396 | 7/2015 |
| CN | 105467323 A | 4/2016 |
| EP | 2985675 | 2/2016 |
| JP | 2015-222928 | 12/2015 |
| JP | 2017-068499 | 4/2017 |
| KR | 10-2011-0037058 | 4/2011 |
| KR | 10-2013-0057520 | 6/2013 |
| KR | 10-2014-0104177 | 8/2014 |
| TW | 201521326 A | 6/2015 |
| TW | 201610454 A | 3/2016 |
| WO | WO 201706836 | 1/2017 |

OTHER PUBLICATIONS

'training.ti.com' [online] "Single-Cell Gauging 101," Powerpoint presentation part 3, Texas Instruments, [retrieved on Aug. 31, 2017] Retrieved from Internet: URL<https://training.ti.com/system/files/docs/Download_Presentation_Part_3.pptx> 31 pages.

'www.digikey.com' [online] "Fuel-Gauge ICs Simplify Li-Ion Cell Charge Monitoring," Stephen Evanczuk, Jan. 15, 2014, [retrieved on Aug. 31, 2017] Retrieved from Internet: URL<https://www.digikey.com/en/articles/techzone/2014/jan/fuel-gauge-ics-simplify-li-ion-cell-charge-monitoring> 4 pages.

'www.ecnmag.com' [online] "Fundamentals of battery fuel-gauging," Karthik Kadirvel, Nov. 16, 2012 [retrieved on Aug. 31, 2017] Retrieved from Internet: URL<https://www.ecnmag.com/article/2012/11/fundamentals-battery-fuel-gauging> 9 pages.

'www.maximintegrated.com' [online] "Battery Fuel Gauges: Accurately Measuring Charge Level," Reinhardt Wagner, Application Note 3958, Dec. 22, 2006 [Retrieved on Aug. 31, 2017] Retrieved From Internet: URL< https://www.maximintegrated.com/en/app-notes/index.mvp/id/3958> 7 pages.

'www.ti.com' [online] "bq27421-G1 System-Side Impedance Track Fuel Gauge with Integrated Sense Resistor," Revised Jan. 2016, [retrieved on Aug. 31, 2017] Retrieved from Internet: URL<http://www.ti.com/lit/ds/symlink/bq27421-g1.pdf> 28 pages.

'www.ti.com' [online] "bq27530-G1 Battery Management Unit Impedance Track Fuel Gauge with MaxLife Technology for Use with the bq2416x Charger Controller," Revised Jun. 2016 [retrieved on Aug. 31, 2017] Retrieved from Internet: URL< http://www.ti.com/lit/ds/slusa15c/slusa15c.pdf> 33 pages.

International Search Report and Written Opinion issued in International Application No. PCT/US2018/028483, dated Aug. 1, 2018, 14 pages.

Peter Fundaro "Impedance Track Based Fuel Gauging," Texas Instruments, Tech. Rep. Sep. 2007, 11 pages.

TW Office Action issued in Taiwanese Application No. 107117653, dated Jan. 10, 2019, 15 pages (with English translation).

Yu et al. "Theory and Implementation of Impedance Track Battery Fuel-Gauging Algorithm in bq2750x Family," Texas Instruments, Application Report, Jan. 2008, 11 pages.

TW Office Action in Taiwanese Appln. No. 107117653, dated May 28, 2019, 10 pages (with English translation).

PCT International Preliminary Report on Patentability in International Appln. No. PCT/US2018/028483, dated Mar. 12, 2020, 8 pages.

CN Office Action in Chinse Application No. 201880023020.7, dated May 25, 2020, 30 pages (with English translation).

IN Office Action in Indian Application No. 201947039140, dated Jun. 30, 2020, 5 pages (with English translation).

KR Office Action in Korean Application No. 10-2019-7028112, dated Apr. 17, 2020, 17 pages (with English translation).

JP Office Action in Japanese Application No. 2019-555166, dated Sep. 29, 2020, 7 pages (with English translation).

* cited by examiner

DYNAMIC BATTERY POWER MANAGEMENT

CROSS-REFERENCE TO RELATED APPLICATION

This application is a continuation application of U.S. application Ser. No. 15/692,546, filed Aug. 31, 2017, which is incorporated by reference.

BACKGROUND

Battery-powered electronic devices often implement power-management systems to regulate battery power usage. Under some conditions, power-management systems may limit the current that can be drawn from the battery to prevent device shut-down.

SUMMARY

In some implementations, battery-powered electronic devices can determine current limits that vary over time to account for changing conditions, such as battery state of charge, battery age, and battery temperature. The battery and system conditions may be sensed at repeated intervals and used to determine a dynamic maximum current limit. The dynamic maximum current limit may change over time as the sensed battery and system conditions change. The device power management system may apply the dynamic maximum current limit, or another dynamic current limit, to allow increased performance, while still avoiding current levels that would cause battery voltage to drop below acceptable levels.

In some previous devices, a power management system applies a fixed lower current limit. The fixed lower current limit may correspond to a worst-case battery condition. For example, instead of using actual characteristics of the battery and without assessing the present battery impedance, some devices set a fixed limit that would avoid undervoltage with a battery that is old, cold, and has low battery charge. When applied by the device power-management system, the fixed lower current limit throttles device performance which extends battery runtime and avoids undervoltage conditions. However, if the actual battery condition is better than the assumed worst-case battery condition, the fixed lower current limit overthrottles the device, reducing device performance more than is actually necessary to avoid undervoltage conditions.

The techniques in the present application can avoid the unnecessary performance reductions of fixed current thresholds by allowing a device to dynamically adjust current limits as battery conditions change. For example, as battery impedance varies with age, temperature, and other factors, the device can sense the change and alter the current limit accordingly. This can avoid unnecessarily reducing device performance by allowing higher currents than typical fixed current limits. By determining and applying a current limit based on the actual sensed battery condition rather than the worst-case battery condition, the device can achieve better device performance while still avoiding current spikes that could result in undervoltage conditions.

In some implementations, the device may allow the user to select a customized current limit. The customized limit may be between the dynamic maximum current limit and the fixed lower current limit. When the user indicates a preference for high performance, the device can select the dynamic maximum current limit to allow the best device performance possible given the actual battery conditions present. On the other hand, if the user indicates a preference for longer battery life, the electronic device can select the fixed lower current limit to provide the longest battery runtime. The device can set a current limit between the maximum dynamic current limit and the fixed lower current limit that provides a trade-off between device performance and battery runtime. This allows for a balance between performance and runtime that can vary according to the settings the user selects.

In one general aspect, an electronic device includes: a battery; one or more sensors configured to sense a voltage provided by the battery and an electric current provided by the battery; and a power management system configured to: sense, using the one or more sensors, a voltage provided by the battery and an electric current provided by the battery; determine a present state of the battery; determine an electric current limit for the electronic device based on the sensed voltage, the sensed electric current, and the determined present state of the battery; and initiate a reduction in power use of the electronic device to maintain electric current draw from the battery at or below the electric current limit.

Implementations may include one or more of the following features. For example, in some implementations, the electronic device is a mobile phone.

In some implementations, the power management system is configured to: periodically repeat a measurement cycle that includes (i) sensing the voltage and electric current provided by the battery, and (ii) determining the present state of the battery, and adjust the electric current limit for the electronic device based on data obtained during the periodically repeated measurement cycles.

In some implementations, the electronic device has a voltage threshold, and the electronic device is configured to power down in response to detecting a voltage that is less than the voltage threshold.

In some implementations, the power management system is configured to obtain data indicating the present state of the battery by obtaining data indicating an open circuit voltage of the battery.

In some implementations, the power management system is configured to obtain the open circuit voltage of the battery by: obtaining data indicating a state of charge of the battery and a temperature of the battery; and determining an open circuit voltage corresponding to the indicated state of charge of the battery and the indicated temperature of the battery.

In some implementations, to determine the electric current limit for the electronic device, the power management system is configured to determine, based on the sensed voltage, the sensed electric current, and the determined state of the battery, a maximum electric current threshold indicating an amount of electric current that the battery can provide without the voltage provided by the battery falling below a predetermined voltage threshold.

In some implementations, the power management system is configured to: determine a battery impedance of the battery based on the sensed voltage and electric current; and determine the electric current limit for the electronic device using the battery impedance.

In some implementations, the electronic device is configured to provide a user interface configured to receive user input indicating a power management preference of a user of the electronic device. The power management system may be configured to determine the electric current limit for the electronic device based on the power management preference indicated by the user input received using the user interface.

In some implementations, the power management system is configured to determine the electric current limit for the electronic device by: determining a first electric current threshold for the electronic device; determining a maximum electric current threshold based on the sensed voltage, the sensed electric current, and the determined state of the battery, the maximum electric current threshold being greater than the first electric current threshold; and selecting, as the electric current limit for the electronic device, an electric current limit in a range from the first electric current threshold to the maximum electric current threshold based on the power management preference indicated by the user input received using the user interface.

In some implementations, selecting the electric current limit includes selecting, based on the power management preference indicated by the user input received using the user interface, an electric current limit that is that is greater than the first electric current threshold and less than the maximum electric current threshold.

In some implementations, the power management system is configured to initiate a reduction in power use of the electronic device by one or more of: dimming a display of the electronic device; reducing electric current supplied to one or more components of the electronic device; reducing a voltage supplied to one or more performance blocks of the electronic device; reducing a clock frequency of one or more processing units of the electronic device; or deactivating one or more components of the electronic device.

In another general aspect, a system or device includes: one or more electronic devices configured to manage power of a battery-powered electronic device, where the system is configured to: obtain a voltage provided by the battery of the electronic device and an electric current provided by the battery of the electronic device; determine a present state of the battery of the electronic device; determine an electric current limit for the electronic device based on the obtained voltage, and the obtained electric current, and the determined present state of the battery; and initiate a reduction in power use of the electronic device to maintain electric current draw from the battery of the electronic device at or below the electric current limit. For example, the system or device may be implemented as one or more power management integrated circuits, such as a power management chip that can be a component of a mobile phone, computer system, or other electronic device.

In another general aspect, a method includes: sensing, by an electronic device that is powered by a battery, a voltage provided by the battery and an electric current provided by the battery; determining, by the electronic device, a present state of the battery; determining, by the electronic device, an electric current limit for the electronic device based on the sensed voltage and electric current and the determined present state of the battery; and managing, by the electronic device, power use of the electronic device to maintain electric current draw from the battery at or below the electric current limit.

Implementations may include one or more of the following features. For example, in some implementations, determining a present state of the battery includes obtaining data indicating a state of charge of the battery, a temperature of the battery, or an open circuit voltage of the battery. Determining the electric current limit for the electronic device can include: determining an electric current threshold for the electronic device based on at least (i) the voltage provided to the electronic device by the battery and (ii) the data indicating the state of charge of the battery, the temperature of the battery, or the open circuit voltage of the battery; and setting the electric current limit for the device based on the determined electric current threshold.

In some implementations, the method includes determining a voltage threshold for the electronic device, and determining the electric current limit for the electronic device is further based on the voltage threshold.

In some implementations, the voltage threshold represents an end of discharge voltage of the battery, a minimum voltage required for operation of the electronic device, or a minimum voltage below which the electronic device is configured to automatically power down.

In some implementations, the method includes operating the electronic device to manage power consumption using a first electric current limit. Setting the electric current limit for the electronic device can include: (i) determining a battery impedance corresponding to the present state of the battery, the battery impedance being based on at least, the sensed voltage, and the sensed electric current; (ii) determining an electric current threshold based at least on the determined battery impedance, where the current limit is based on the current threshold; and (iii) changing an electric current limit for the electronic device from the first electric current limit to a second electric current limit that is based on the determined electric current threshold, where the second electric current limit is different from the first electric current limit.

In some implementations, the method includes periodically obtaining updated data indicating the present state of the battery and voltage and current provided by the battery, and periodically adjusting the electric current limit for the electronic device based on the updated data.

In some implementations, the electronic device repeats the operations of obtaining updated data and adjusting the electric current limit at a rate between once per hour and 1 MHz.

In some implementations, the method includes providing a user interface configured to receive user input indicating a power management preference of a user of the electronic device. Setting the electric current limit for the electronic device can be based on the power management preference indicated by the user input received using the user interface.

Other embodiments of these aspects include corresponding systems, apparatus, firmware, and software programs, configured to perform the actions of the methods, encoded on machine-readable storage devices. A system of one or more device can be so configured by virtue of software, firmware, hardware, or a combination of them installed on the system that in operation cause the system to perform the actions. One or more software programs can be so configured by virtue having instructions that, when executed by data processing apparatus, cause the apparatus to perform the actions.

In some implementations, the techniques disclosed in the application can provide one or more of the following advantages. Power management settings based on the actual battery condition can provide better device performance than settings based on a worst-case battery condition while still preventing undervoltage conditions and the sudden device shut-down that can result. The device can determine power management settings that vary over time and reflect changes in battery condition, preventing unnecessary reductions in device performance. The device can provide an enhanced user experience by determining power management settings that are customized to a user's preference for balancing battery runtime and better device performance.

The details of one or more embodiments of the invention are set forth in the accompanying drawings and the description below. Other features and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
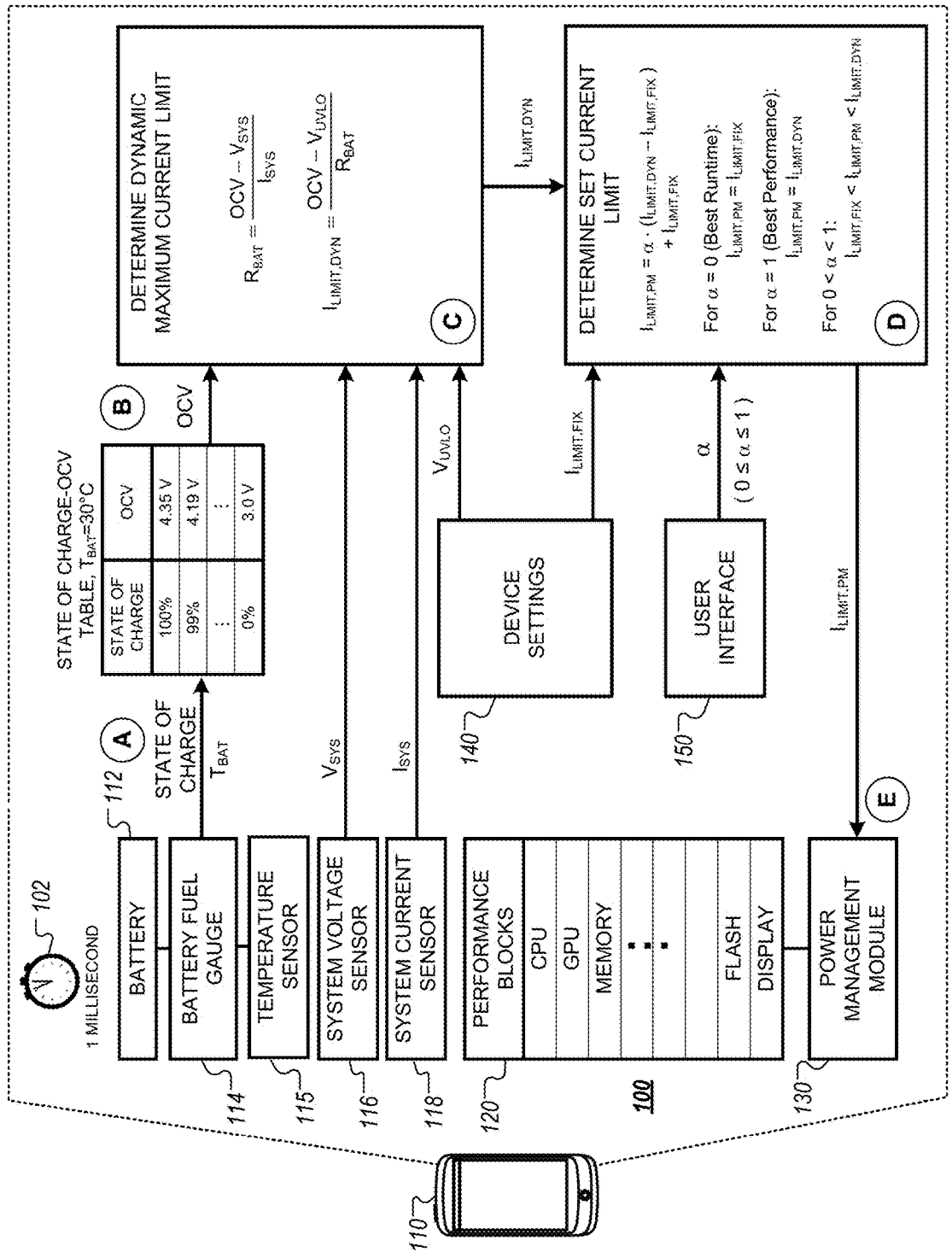
FIG. 1 is a diagram that illustrates an example of a system for dynamic battery power management.

FIG. 1 is a diagram that illustrates an example of a system 100 for dynamic battery power management. The system 100 includes a device 110 powered by a battery, and the device 110 manages the rate that it consumes power from the battery. The example of FIG. 1 shows how the device 110 can adjust a current limit to account for the current state of the device 110 and its battery. FIG. 1 shows stages (A) through (E), which illustrate a flow of data.

In some implementations, the device 110 can dynamically adjust current limits and other power management settings in response to changing conditions. Device-level current limits for the device 110 can be adjusted, while the device 110 is in use, to reflect changes in temperature, battery impedance, and battery condition. For example, varying current limits may be set to take into account changes in battery age, battery temperature, device temperature, state of charge of the battery, and other factors. As a result, the device 110 can vary its current limit in real-time or near real-time to respond to changing conditions.

In the example of FIG. 1, the device 110 determines various parameters during periodic measurement cycles. For example, at a predetermined measurement interval 102, the device 110 can perform measurement operations to sense a battery state of charge, a battery temperature $T_{BAT}$, a system voltage $V_{SYS}$ provided by the battery, and a system current $I_{SYS}$ provided by the battery. The results of these measurements can be used to adjust the current limit.

The device 110 may be, for instance, a mobile phone, a laptop, a tablet, a wearable device, a smartphone, a cellphone, a calculator, a watch, a mobile computing device, or other battery-powered electronic device.

The device 110 includes a battery 112, a battery fuel gauge 114, a temperature sensor 115, a system voltage sensor 116, a system current sensor 118, performance blocks 120, a power management module 130, device settings 140, and a user interface 150.

The battery 112 provides power to the device 110. The battery 112 may be, for example, a lithium ion device, a lithium-ion polymer device, a nickel metal hydrate device, a nickel cadmium device, or other device that provides power to the device 110. The battery 112 may comprise a single cell or multiple cells and may be rechargeable.

The battery 112 has a battery impedance $R_{BAT}$. The battery impedance $R_{BAT}$ may change over time and may depend on many factors. For example, the battery impedance $R_{BAT}$ may change with battery age, battery temperature, or battery state of charge. Often, the battery impedance $R_{BAT}$ will increase as the battery ages, becomes colder, or has a low state of charge.

The battery fuel gauge 114 is connected to the battery 112 and provides an output that indicates the battery's state of charge. The battery fuel gauge 114 may be integrated as part of the battery 112, may be a unit separate from the battery 112, or may be part of a larger battery management system. The battery fuel gauge 114 may comprise an integrated circuit.

The battery fuel gauge 114 may use any method or combination of methods to measure or estimate the state of charge of battery 112. For example, the battery fuel gauge 114 may measure the state of charge by applying a controlled discharge to battery 112. As another example, the battery fuel gauge 114 may estimate the state of charge by coulomb counting during charging and/or discharging battery 112.

The temperature sensor 115 measures a battery temperature $T_{BAT}$. The temperature sensor 115 may be any appropriate device that senses the temperature, for instance, a thermistor. The temperature sensor 115 is located in close proximity to the battery 112. For example, the temperature sensor 115 may be integrated into the package of battery 112, or it may be attached to circuit module connected to battery 112. In some implementations, like that shown in FIG. 1, the temperature sensor 115 provides an output indicating battery temperature $T_{BAT}$ to the battery fuel gauge 114.

The system voltage sensor 116 measures the system voltage $V_{SYS}$. The system voltage $V_{SYS}$ represents the total voltage delivered by the battery 112 to the device 110. It includes the voltage supplied by the battery 112 to power all components within the device 110. The system voltage sensor 116 may continuously sense the system voltage $V_{SYS}$. Alternatively, the system voltage sensor 116 may sense the system voltage $V_{SYS}$ at periodic intervals. Those periodic intervals may be regular or irregular. The system voltage sensor 116 may sense the system voltage $V_{SYS}$ in response to a query or signal from another component within the device 110.

The system current sensor 118 measures the system current $I_{SYS}$. The system current $I_{SYS}$ represents the total current delivered by the battery 112 to the device 110. It includes the current supplied by the battery 112 to power all components within the device 110. The system current sensor 118 may continuously sense the system current $I_{SYS}$. Alternatively, the system current sensor 118 may sense the system current $I_{SYS}$ at periodic intervals. Those periodic intervals may be regular or irregular. The system current sensor 118 may sense the system current $I_{SYS}$ in response to a query or signal from another component within the device 110. The performance blocks 120 include components within the device 110 that draw power from the battery 112. For example, the performance blocks 120 may include a central processing unit (CPU), a graphics processing unit (GPU), a memory system, an external light, a flash, a display system, a processing module, or any other element within the device 110 that draws power from the battery 112.

The power management module 130 regulates power consumption of the device 110. The power management module 130 may be implemented in software or hardware, and may comprise an integrated circuit. To regulate power consumption, the power management module 130 may implement one or a combination of settings and techniques.

For example, the power management module 130 may limit the power consumption of device 110 by limiting the system current $I_{SYS}$ provided by the battery 112 to the device 110. The power management module 130 may limit currents by, for instance, throttling or disabling individual performance blocks 120. For example, the power management module 130 may dim or turn off the display. As another example, the power management module 130 may regulate power consumption by implementing dynamic voltage scaling or dynamic frequency scaling.

The device 110 stores device settings 140, which can be parameters and settings that affect the operation of the device 110. The device settings 140 are stored within the device 110, for example, in a memory of device 110.

The user interface 150 enables a user of the device 110 to interact with the device 110. For example, the user may input data to the device 110 through the user interface 150. As another example, the device 110 may display messages to the user or prompt the user for input through the user interface 150. The user interface 150 may comprise, for instance, a touchscreen display, an LCD display, or a keyboard.

In some implementations, the device 110 includes one or more processing modules that can perform the operations discussed with respect to stages (A) through (E). For example, the device 110 may use a CPU, the power management module 130, a device chipset, and/or other processing modules, alone or in combination, to carry out the operations discussed below. The techniques may be implemented in hardware, firmware, software, or some combination or sub-combination of them. In some implementations, an operating system, application, or other software of the device 110 may coordinate or manage the measurement cycles and power management operations. In other implementations, power management, including setting the timing and characteristics of measurement cycles and current limits, may be performed by hardware modules independently of an operating system.

During stage (A), the device 110 performs a measurement cycle. During the measurement cycle, the device 110 can sense various properties of the battery and/or other aspects of the device 110. For example, during the measurement cycle the device 110 can sense a battery state of charge, a battery temperature $T_{BAT}$, a system voltage $V_{SYS}$, and a system current $I_{SYS}$.

The battery state of charge is sensed by the battery fuel gauge 114. The battery fuel gauge 114 typically provides an output that indicates the state of charge of the battery 112, for example, as a percentage of the battery's full charge capacity. For instance, when the battery 112 is fully charged, the battery fuel gauge 114 may provide an output that corresponds to 100%. When the battery 112 is at half charge capacity, the battery fuel gauge 114 may provide an output that corresponds to 50%.

The battery temperature $T_{BAT}$ is sensed by the temperature sensor 115. In some implementations, the temperature sensor 115 provides an output indicating the battery temperature $T_{BAT}$ to the battery fuel gauge 114.

The system voltage $V_{SYS}$ is sensed by the system voltage sensor 116. The system voltage $V_{SYS}$ represents a measured value of the voltage delivered by the battery 112 to the device 110 during the measurement cycle. The voltage $V_{SYS}$ represents the voltage provided to the device 110 as a whole, e.g., across the system load impedance $R_{SYS}$, where the system impedance $R_{SYS}$ is the combined impedance of all components within the device 110 that draw power from the battery 112. The system impedance $R_{SYS}$ of the device 110 can be considered to be series-connected to the battery impedance $R_{BAT}$ of the battery 112.

The system current $I_{SYS}$ is sensed by the system current sensor 118. The system current $I_{SYS}$ represents a measured value of the electric current delivered by the battery 112 to the device 110 during the measurement cycle. For example, the system current $I_{SYS}$ can represent the current delivered while the battery provides the amount of voltage measured as system voltage $V_{SYS}$. The system current $I_{SYS}$ represents the total current provided by the battery 112, e.g., the amount of current provided to the system load impedance $R_{SYS}$, which represents the total impedance of the device 110 that is seen by the battery. Because the battery impedance $R_{BAT}$ can be considered series-connected to the system impedance $R_{SYS}$, the system current $I_{SYS}$ also appears across the battery impedance $R_{BAT}$.

In stage (B), the device 110 determines the battery open circuit voltage OCV corresponding to the sensed battery state of charge and battery temperature $T_{BAT}$. The battery open circuit voltage OCV is the maximum ideal voltage that can be supplied by the battery 112. The battery open circuit voltage OCV may vary with time. For example, the battery open circuit voltage OCV typically varies with the battery state of charge. The battery open circuit voltage OCV is maximum when the battery 112 is fully charged and decreases as the battery 112 discharges. For example, the open circuit voltage OCV may be 4.35 V when the battery 112 is at a 100% state of charge (fully charged), and may decrease to 3.0 V when the battery 112 is at a 0% state of charge (fully discharged). The battery open circuit voltage OCV also typically varies with battery temperature.

In some implementations, the device 110 determines the battery open circuit voltage OCV by referring to one or more tables. The one or more tables associate a battery state of charge and a battery temperature with an expected battery open circuit voltage OCV. For example, the device 110 may store one or more tables in a memory system of device 110 and use the sensed state of charge and the sensed battery temperature $T_{BAT}$ to look up the corresponding battery open circuit voltage in one of the stored tables. In some implementations, the device 110 may interpolate between values in one or more tables to determine the battery open circuit voltage OCV expected for the actual sensed state of charge and battery temperature $T_{BAT}$. A state of charge table may be predetermined, for instance, by a battery manufacturer or measured by the battery fuel gauge 114.

The battery open circuit voltage OCV can be considered to be delivered across the series connection of the battery impedance $R_{BAT}$ and the system impedance $R_{SYS}$. When there is a non-zero system current $I_{SYS}$, there is a voltage drop $V_{BAT,IR}$ across the internal battery impedance $R_{BAT}$ due to the system current $I_{SYS}$:

$$V_{BAT,IR} = I_{SYS} \cdot R_{BAT} \qquad (1)$$

As a result, the system voltage $V_{SYS}$ delivered to the device 110 by the battery 112 is reduced from the battery open circuit voltage OCV by the voltage dropped across the battery impedance $R_{BAT}$:

$$V_{SYS} = OCV - V_{BAT,IR} \qquad (2)$$

In stage (C), the device 110 determines a dynamic maximum current limit $I_{LIMIT,DYN}$. The dynamic maximum current limit $I_{LIMIT,DYN}$ represents an electric current threshold for the device given the current conditions of the battery 112 and the device 110. For example, dynamic maximum current limit $I_{LIMIT,DYN}$ can represent a maximum amount of system current, $I_{SYS}$, that the battery 112 can provide to the device 110 conditions without causing the system voltage, $V_{SYS}$, to decrease below a voltage threshold. This threshold may be, for example, an end of discharge voltage of the battery, a minimum voltage required for operation of the electronic device, or a minimum voltage below which the electronic device is configured to automatically power down. For example, the voltage threshold may be a system under-voltage lock-out voltage $V_{UVLO}$.

The system under-voltage lock-out voltage $V_{UVLO}$ is a minimum threshold voltage related to the required operational voltage of the device 110. If the system voltage $V_{SYS}$ is detected to drop below the system under-voltage lock-out voltage $V_{UVLO}$, the device 110 may shut-down to prevent device 110 from operating below the required operational voltage. For instance, if the system under-voltage lock-out voltage $V_{UVLO}$ is 2.7 V and the device 110 senses a system voltage $V_{SYS}$ of 2.69 V, the device 110 may initiate a shut-down process. The system under-voltage lock-out voltage $V_{UVLO}$ may be predetermined, may not change with time, and may be stored in the device settings 140. For example, the system under-voltage lock-out voltage $V_{UVLO}$ may be a system setting that is set by the device manufacturer.

Under some conditions, the system voltage $V_{SYS}$ may drop below the system under-voltage lock-out voltage $V_{UVLO}$ due to a low battery state of charge. For example, during operation of device 110, the battery state of charge decreases as the battery 112 is discharged. As the battery state of charge decreases, the open circuit voltage OCV delivered by the battery 112 to the device 110 also decreases. As indicated by equation (2), as the battery open circuit voltage OCV decreases, the system voltage $V_{SYS}$ also decreases. When the battery 112 discharges to a state of charge that reduces the system voltage $V_{SYS}$ below the system under-voltage lock-out voltage $V_{UVLO}$, the battery 112 can no longer provide the required operational voltages and the device 110 may power down.

Under some conditions, the system voltage $V_{SYS}$ may drop below the system under-voltage lock-out voltage $V_{UVLO}$ even if the battery 112 can provide the operational voltages required by device 110. For example, the system voltage $V_{SYS}$ may drop below the system under-voltage lock-out voltage $V_{UVLO}$ due to an increased system current $I_{SYS}$. An increased system current $I_{SYS}$ may arise, for instance, by an increased computing demand in the device 110. Because the battery impedance $R_{BAT}$ and system impedance $R_{SYS}$ can be considered series-connected, an increased system current $I_{SYS}$ will cause an increased voltage drop $V_{BAT}$ across the battery impedance $R_{BAT}$, as indicated by equation (1). The increased voltage drop $V_{BAT}$ will reduce the system voltage $V_{SYS}$, as indicated by equation (2). If the system voltage $V_{SYS}$ decreases below the system under-voltage lock-out voltage $V_{UVLO}$, the device 110 may power down. Here, the battery 112 may be sufficiently charged to generate the necessary system voltage $V_{SYS}$ at a lower system current $I_{SYS}$. In this case, because the battery 112 retains sufficient charge to provide the operational voltages required by device 110, the shut-down of device 110 is considered premature.

The dynamic maximum current limit $I_{LIMIT,DYN}$ represents the maximum system current $I_{SYS}$ that the battery 112 can provide to device 110 without causing the system voltage $V_{SYS}$ to decrease below a system under-voltage lock-out voltage $U_{UVLO}$, which results in premature shut-down of device 110. The dynamic maximum current limit $I_{LIMIT,DYN}$ may vary over time. In particular, the dynamic maximum current limit $I_{LIMIT,DYN}$ can vary over time based on the condition of the battery. For example, the dynamic maximum current limit $I_{LIMIT,DYN}$ can vary over time based on the battery impedance $R_{BAT}$, which may depend on the age of the battery 112, the state of charge of the battery 112, and the battery temperature $T_{BAT}$. The dynamic maximum current limit $I_{LIMIT,DYN}$ can also vary based on other factors, for instance, the device condition.

To determine $I_{LIMIT,DYN}$, in some implementations the device 110 determines the present battery impedance $R_{BAT}$ based on the sensed system voltage $V_{SYS}$, the sensed system current $I_{SYS}$, and the determined present battery condition as indicated by the battery open circuit voltage OCV:

$$R_{BAT} = \frac{OCV - V_{SYS}}{I_{SYS}} \quad (3)$$

where the battery open circuit voltage OCV was determined in stage (B) based on the sensed battery state of charge and battery temperature $T_{BAT}$. The dynamic maximum current limit $I_{LIMIT,DYN}$ may then be determined by $$I_{LIMIT,DYN} = \frac{OCV - V_{UVLO}}{R_{BAT}} \quad (4)$$

where the present battery impedance $R_{BAT}$ is described by equation (3). The determined battery impedance $R_{BAT}$ represents the impedance of the battery at the time of the measurement and takes into account factors including battery age, battery condition, and battery temperature. In some implementations, $R_{BAT}$ may include the impedance of any connections between the battery and the system load.

In stage (D), device 110 determines a power management current limit $I_{LIMIT,PM}$ to be used by the power management module 130 to regulate power usage of the device 110. In some implementations, the power management module 130 may apply power management settings and techniques to prevent the system current $I_{SYS}$ from exceeding the power management current limit $I_{LIMIT,PM}$.

Limiting the system current $I_{SYS}$ can have various desirable and undesirable effects on the behavior of device 110. For example, limiting system current $I_{SYS}$ has the desirable effect of preventing premature shut-down of device 110 due to temporary increases (e.g. spikes) in the system current $I_{SYS}$. Limiting system current $I_{SYS}$ also has the desirable effect of extending the battery runtime by slowing the discharge of the battery 112. Limiting system current $I_{SYS}$ may have the undesirable effect of throttling the performance of device 110, where limiting the current available the device 110 results in slowing the execution of processes, running fewer processes, or other degradations in device performance.

The relative impact of these effects on the behavior of device 110 may vary based on the power management current limit $I_{LIMIT,PM}$. For example, a lower power management current limit $I_{LIMIT,PM}$ imposes a more restrictive limit on the system current $I_{SYS}$ delivered to device 110. A more restricted system current $I_{SYS}$ leads to a longer battery runtime by slowing the rate of discharge of battery 112. However, a more restricted system current $I_{SYS}$ also leads to greater performance throttling by limiting the current available to the device 110 for completing device operations. Alternatively, a higher power management current limit $I_{LIMIT,PM}$ imposes a less restrictive limit on the system current $I_{SYS}$. A less restricted system current $I_{SYS}$ leads to better device performance by providing more system current $I_{SYS}$ to device 110 for completing device operations. However, a less restricted system current $I_{SYS}$ also reduces battery runtime by discharging the battery more quickly.

In some implementations, the device 110 may determine the power management current limit $I_{LIMIT,PM}$ to select between or balance desirable and undesirable effects of limiting system current $I_{SYS}$. For example, the device 110 may determine the power management current limit $I_{LIMIT,PM}$ to extend battery runtime, to achieve better device performance, or to trade-off between extended battery runtime and better device performance. For example, the device 110 may set the power management current limit $I_{LIMIT,PM}$ to a relatively low value to extend battery runtime. As another example, the device 110 may set the power management current limit $I_{LIMIT,PM}$ to a relatively high value to achieve better device performance. As a third example, the device 110 may set the power management current limit $I_{LIMIT,PM}$ to an intermediate value to trade-off battery runtime and device performance.

The power management current limit $I_{LIMIT,PM}$ can be generated based on one or more other current limits of the device 110. For example, the device 110 can store a setting that indicates a fixed lower current limit $I_{LIMIT,FIX}$. The fixed lower current limit $I_{LIMIT,FIX}$ may be determined in order to prevent the system voltage $V_{SYS}$ from dropping below the system under-voltage lock-out voltage $V_{UVLO}$ for a worst-case battery condition (e.g. a high battery impedance $R_{BAT}$). The worst-case battery condition may correspond to a battery that is old, cold, and near fully discharged. The fixed lower current limit $I_{LIMIT,FIX}$ may be predetermined. For instance, the fixed lower current limit $I_{LIMIT,FIX}$ may be a system setting that is set by the manufacturer or set by software of the device 110. The fixed lower current limit $I_{LIMIT,FIX}$ is typically less than the dynamic maximum current limit $I_{DYN,LIM}$.

In some implementations, the device 110 may set the power management current limit $I_{LIMIT,PM}$ to the fixed lower current limit $I_{LIMIT,FIX}$, to the dynamic maximum current limit $I_{LIMIT,DYN}$, or to any value between the fixed lower current limit $I_{LIMIT,FIX}$ and the dynamic maximum current limit $I_{LIMIT,DYN}$. For example, a device 110 may set the power management current limit $I_{LIMIT,PM}$ to the fixed lower current limit $I_{LIMIT,FIX}$ to extend battery runtime. Alternatively, a device 110 may set the power management current limit $I_{LIMIT,PM}$ to the dynamic maximum current limit $I_{LIMIT,DYN}$ to achieve better device performance. A device 110 may set the power management current limit $I_{LIMIT,PM}$ to a value between the fixed lower current limit $I_{LIMIT,FIX}$ and the dynamic maximum current limit $I_{LIMIT,DYN}$ to balance battery runtime and better device performance.

In some implementations, a user can vary the characteristics of the power management current limit $I_{LIMIT,PM}$. For example, through the user interface 150, the user may select a power management preference for device 110 that emphasizes extending battery runtime, achieving better device performance, or balancing extended battery runtime and better device performance. If the user selects a power management preference that emphasizes extending battery runtime, the power management current limit $I_{LIMIT,PM}$ may be set to the fixed lower current limit $I_{LIMIT,FIX}$. If the user selects a power management preference that emphasizes achieving better device performance, the power management current limit $I_{LIMIT,PM}$ may be set to the dynamic maximum current limit $I_{LIMIT,DYN}$. If the user selects a power management preference that balances extended battery runtime and better device performance, the power management current limit $I_{LIMIT,PM}$ may be set to a value between the fixed lower current limit $I_{LIMIT,FIX}$ and the dynamic maximum current limit $I_{LIMIT,DYN}$.

An individual user may select a power management preference that is different than another individual user's preference. For example, one user may select a power management preference that emphasizes extending battery runtime, while another user may select a power management preference that emphasizes achieving better device performance. An individual user may also select different power management preferences at different times. For example, a user may select a power management preference that emphasizes extending battery runtime when she will be unable to charge the battery 112 for a prolonged period of time. Alternatively, the same user may select a power management preference that emphasizes achieving better device performance when she will be able to charge the battery 112 in the near future.

In some implementations, the user-selected power management preference may be represented by a parameter $\alpha$. The parameter $\alpha$ is between 0 and 1 and may be equal to 0 or 1. The parameter $\alpha$ may be selected by a user and input through the user interface 150. The parameter $\alpha$ allows the power management current limit $I_{LIMIT,PM}$ to be determined between the fixed lower current limit $I_{LIMIT,FIX}$ and the dynamic maximum current limit $I_{LIMIT,DYN}$ according to:

$$I_{LIMIT,PM} = \alpha \cdot (I_{LIMIT,DYN} - I_{LIMIT,FIX}) + I_{LIMIT,FIX} \qquad (6)$$

For $\alpha$ equal to 0, the power management current limit $I_{LIMIT,PM}$ is equal to $I_{LIMIT,FIX}$. For $\alpha$ equal to 1, the power management current limit $I_{LIMIT,PM}$ is equal to $I_{LIMIT,DYN}$. For any value of $\alpha$ between 0 and 1, the power management current limit $I_{LIMIT,PM}$ is between $I_{LIMIT,FIX}$ and $I_{LIMIT,DYN}$. As shown in equation 6, the device 110 can interpolate a value of the power management current limit $I_{LIMIT,PM}$ using information about user preferences, e.g., by using a weighting or scaling factor to vary the current limit within a range.

In stage (E), the power management module 130 dynamically adjusts power management settings and techniques within the device 110 to ensure that the current drawn from the battery 112 remains at or below the power management current limit $I_{LIMIT,PM}$. For example, the device 110 may store data indicating the typical or expected current draw of different performance blocks 120 at different settings. Based on this data characterizing the power usage of different components at different operating conditions, the power management module 130 can set power management settings for each performance block 120 so that the combined current needed by the device is below the power management current limit $I_{LIMIT,PM}$. The power management settings may control, for instance, the brightness of a display, the CPU frequency, or whether a given block is enabled or disabled. In this manner, the power management module can set limits on the operating modes of the performance blocks 120 to maintain current below the current power management current limit. For example, from stored information indicating the current draw of a CPU, GPU, or other processor of the device 110 at different operating frequencies, the power management module 130 may set a frequency limit that limits the operating frequency to less than the typical or maximum operating frequency when operating at full power. As another example, the power management module 130 may deactivate one or more processing cores to limit current draw. As another example, the power management module 130 may limit the power levels for a radio transceiver, or may limit the modes in which the radio transceiver can operate. The extent and type of limitations imposed by the power management module 130 can be dynamically changed as the power management power management current limit $I_{LIMIT,PM}$ changes.

In some implementations, the power management module 130 may adjust the settings for each performance block 120 to prioritize some blocks over other blocks. For example, the power management module 130 may allocate more current to performance blocks 120 that are critical for operation, such as a CPU or a modem, while limiting current to blocks less critical for device operation, such as a display or a camera flash.

The behavior of device 110 can vary depending upon the value of the power management current limit $I_{LIMIT,PM}$. For example, a power management current limit $I_{LIMIT,PM}$ equal to the fixed lower current limit $I_{LIMIT,FIX}$ imposes a more restrictive current limit on the device 110. The more restrictive current limit extends battery runtime by reducing the discharge rate of the battery 112, but also leads to greater throttling of device performance by limiting the current available for device operations. A power management current limit $I_{LIMIT,PM}$ equal to the dynamic maximum current limit $I_{LIMIT,DYN}$ imposes a less restrictive current limit on the device 110. The less restrictive current limit leads to better device performance by providing more current to device 110 for device operations, but also reduces battery runtime by discharging the battery more quickly. A power management current limit $I_{LIMIT,PM}$ equal to an intermediate value between the fixed lower current limit $I_{LIMIT,FIX}$ and the dynamic maximum current limit $I_{LIMIT,DYN}$ imposes a current limit on the device 110 that balances battery runtime and device performance. For instance, a power management current limit $I_{LIMIT,PM}$ closer to the dynamic maximum current limit $I_{LIMIT,DYN}$ than to the fixed lower current limit $I_{LIMIT,FIX}$ may lead to slightly extended battery runtime and substantially better device performance, while a power management current limit $I_{LIMIT,PM}$ closer to the fixed lower current limit $I_{LIMIT,FIX}$ than to the dynamic maximum current limit $I_{LIMIT,DYN}$ may lead to substantially extended battery runtime, but slightly better device performance.

The power management current limit $I_{LIMT,PM}$ may be varied by a user based on her power management preferences. By setting the power management current limit $I_{LIMIT,PM}$ based on a user's preference, the device 110 can implement a power management approach customized to the individual user.

In some implementations, the system 100 repeats stages (A) through (E) at periodic time intervals 102. The time intervals 102 may vary and may be regular or irregular. For example, the time interval 102 may be the clock cycle of a power management IC, e.g., on the order of microseconds, within device 110. The stages (A) to (E) can be performed at other rates, for example, with a measurement cycle and/or determination of a current limit being performed at a rate of 1 Mhz, 100 kHz, 10 kHz, 1 kHz, 100 Hz, 10 Hz, etc. In some implementations, the time interval 102 may also be several seconds or minutes. In general, it can be advantageous to perform measurements and update the current limit at least once per second, or potentially much more frequently, in order to respond to changes in temperature, state of charge, and other factors that affect battery impedance. Nevertheless, for some systems having a relatively large battery capacity compared to the load current, or where loads and environmental conditions are stable, current limits may be updated less frequently, e.g., once every several minutes. In the example of FIG. 1, the time interval 102 is one millisecond, indicating the system 100 performs stages (A) through (E) once every millisecond, e.g., at a rate of 1 kHz.

By repeating stages (A) through (E) at periodic time intervals, the system 100 can determine current limits that vary over time to account for changing conditions, such as battery state of charge, battery age, and battery temperature. For some time intervals 102, the current limits can be determined in real time or near-real time to reflect the present condition of the system. In some implementations, the device 110 may incorporate real-time or near-real-time feedback control to prevent device 110 from powering down when the system voltage $V_{SYS}$ momentarily drops below the system under-voltage lock-out voltage $V_{UVLO}$. For example, if the device 110 determines that the system voltage $V_{SYS}$ drops below the system under-voltage lock-out voltage $V_{UVLO}$ during a measurement cycle, the device 110 may reduce the power management current limit $I_{LIM,PM}$, which prompts the power management module 130 to implement settings that decrease the system current $I_{SYS}$ and increase the system voltage $V_{SYS}$. If the system voltage $V_{SYS}$ increases above the system under-voltage lock-out voltage $V_{UVLO}$ before the device 110 initiates shut-down, the device 110 may be prevented from powering off due to an under-voltage condition.

During each time interval 102, the system 100 may also determine the user power management preference and set the power management current limit $I_{LIMIT,PM}$ to reflect both the present condition of the system and the present user power management preference. In this way, the system 100 can improve the user experience by varying over time the custom power management approach implemented based on the present preferences of the current user.

Figure 2:
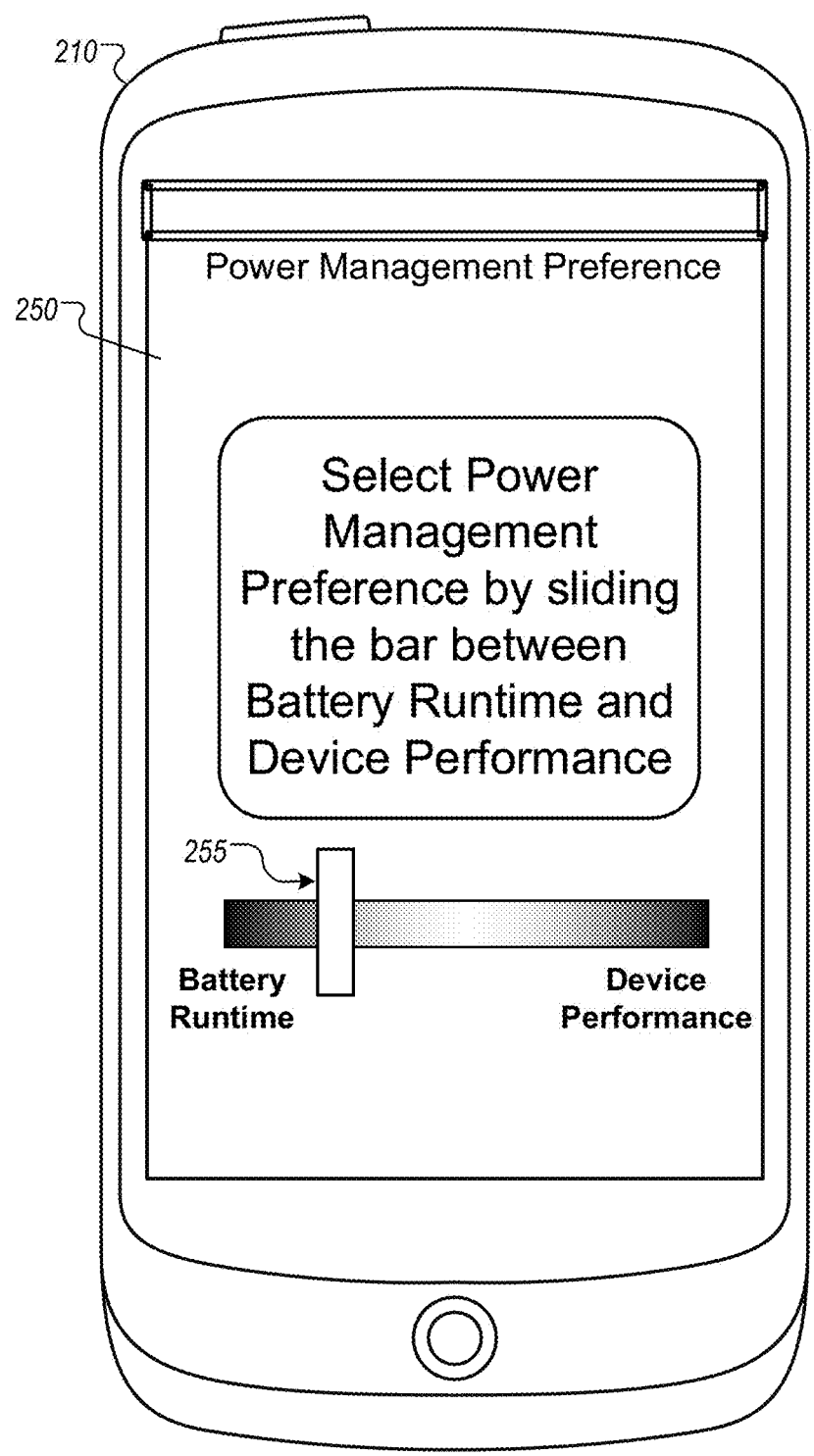
FIG. 2 is an example user interface for specifying dynamic battery power management preference.

FIG. 2 is an example user interface for specifying dynamic battery power management preference. The user interface 250 is part of a battery-powered device 210 that implements a power management system, for instance, the system 100 illustrated in the example of FIG. 1.

In the example of FIG. 2, the user interface 250 is a touchscreen display, through which the device 210 can display messages and prompt a user for input through user interface 250. The user can also input data to the device 210 through the user interface 250.

The device 210 displays a message to the user on the user interface 250. The message prompts the user to select a power management preference and provides instructions how to select a preference. In the example of FIG. 2, the message instructs the user to select a power management preference by sliding a bar between Battery Runtime and System Performance. By adjusting the position of the bar 255 along the scale between Battery Runtime and Device Performance, the user can input her preference for power management to the device 210.

For example, if the user prefers that the device 210 determines power management settings that emphasize extending battery runtime, she can place the bar 255 at the left end the scale. In this case, the device 210 may determine power management settings that maximize battery runtime. Alternatively, if the user prefers that the device 210 determines power management settings that emphasize better device performance, she can place the bar 255 at the right end of the scale. In this case, the device 210 may determine power management settings that maximize device performance.

In some implementations, the user may also place the bar 255 at any intermediate position along the scale, in which case device 210 may determine power management settings that trade-off between extending battery runtime and achieving better device performance. The relative position of the bar 255 may indicate the relative importance of extending battery runtime and achieving better device performance in determining power management settings. For example, a bar 255 placed at the midpoint of the scale may indicate that device 210 will determine power management settings that trade-off equally between extending battery runtime and achieving better device performance. Alternatively, a bar 255 placed between the left end of the scale and the midpoint of the scale may indicate that the device 210 will determine power management settings that trade-off between extending battery runtime and achieving better device performance, but place greater emphasis on extending battery runtime.

In some implementations, the device 210 may use the power management preference input by the user to determine customized power management settings. For example, the device 210 may associate the position of the bar 255 with a value for the parameter α used to determine the power management current limit $I_{LIMIT,PM}$ in stage (D) of FIG. 1. For the example of FIG. 2, a bar placed at the left end of the scale corresponds to a value of 0 for α, a bar placed at the right end of the scale corresponds to a value of 1 for α, and a bar placed at a position between the left end and the right end of the scale corresponds to a value between 0 and 1 for α. In the specific example depicted in FIG. 2, the bar 255 is located near the left end of the scale, approximately 25% of the distance to the right end of the scale, which corresponds to a value of 0.25 for α.

The user interface 250 can provide any of various types of controls to allow the user to specify power management preferences. For example, the user interface 250 may include multiple selectable options or profiles, a dial, a number entry field, a drop box, or a sliding scale.

Figure 3:
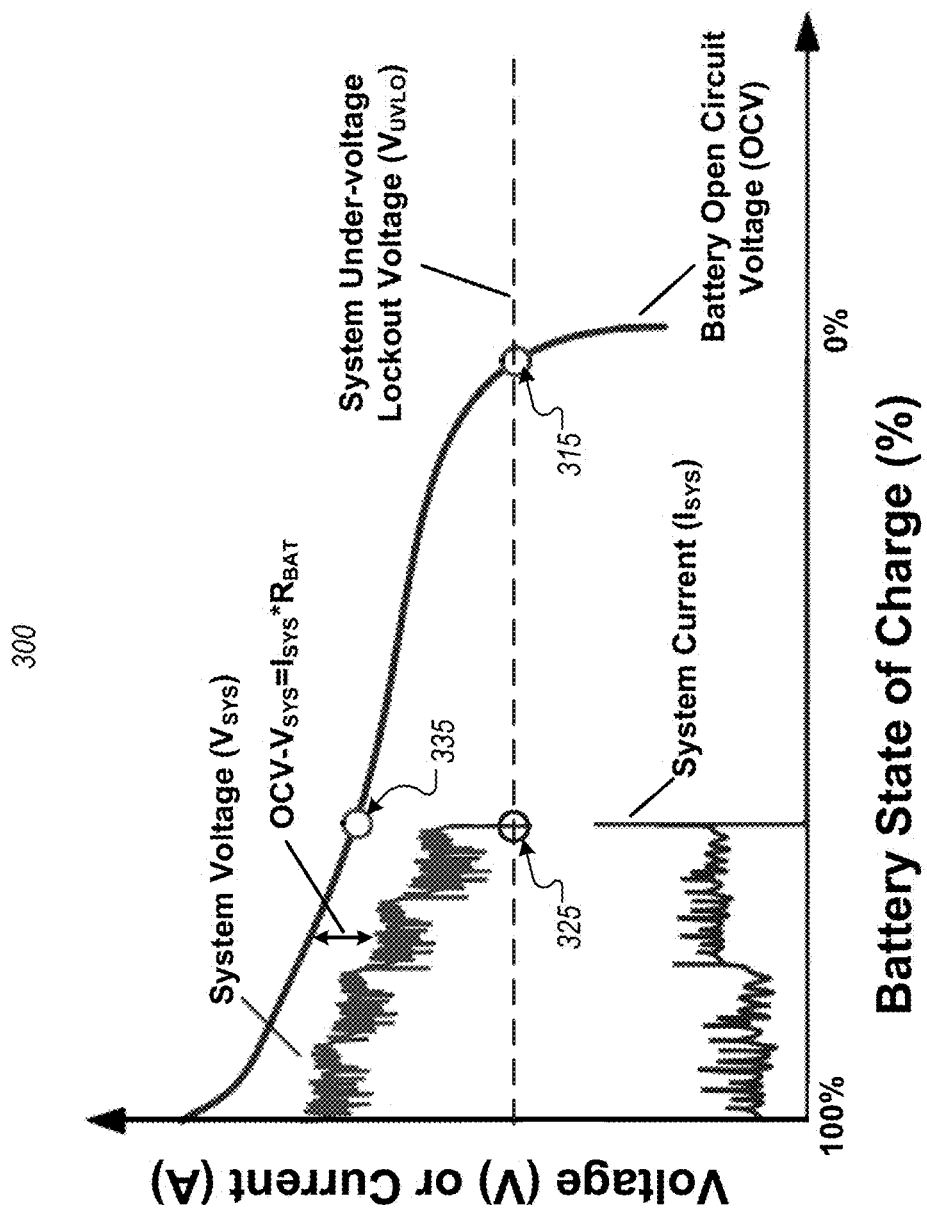
FIG. 3 is a chart that illustrates an example of battery management that can lead to premature device shut-down.

FIG. 3 is a chart that illustrates an example of battery management that can lead to premature device shut-down. Here, premature device shut-down refers to a situation where a device powers down before its battery is near full discharge, e.g., when under voltage protection powers down the device even though the battery still holds sufficient charge to continue operating the device. At the point of premature shut-down, the battery can still supply sufficient voltage for the device to operate using a lower current level. In the example of FIG. 3, increased system current $I_{SYS}$ induces a voltage drop across the battery impedance $R_{BAT}$ that reduces the system voltage $V_{SYS}$ below the system under-voltage lockout voltage $V_{UVLO}$. The drop in system voltage $V_{SYS}$ causes the device to power down before the battery nears full discharge.

Chart 300 plots the battery open circuit voltage OCV, the system voltage $V_{SYS}$, and the system current $I_{SYS}$ as a function of the battery state of charge. The battery open circuit voltage OCV is at a high value when the battery state of charge is 100% (fully charged). As the battery discharges and the battery state of charge decreases to 0% (fully discharged), the battery open circuit voltage OCV decreases.

The system under-voltage lockout voltage $V_{UVLO}$ defines the system voltage $V_{SYS}$ at which the device powers down. In the example of FIG. 3, the system under-voltage lockout voltage $V_{UVLO}$ is set near the battery open circuit voltage OCV of a fully-discharged battery, as indicated by position 315.

As shown in chart 300, for a given battery state of charge, the system voltage $V_{SYS}$ is less than the battery open circuit voltage by a voltage equal to the system current $I_{SYS}$ multiplied by the battery impedance $R_{BAT}$. If the system current $I_{SYS}$ increases, the battery impedance $R_{BAT}$ will tend to decrease the voltage that the battery can supply to the system at the increased level of current. As a result, the system voltage $V_{SYS}$ may drop below the system under-voltage lockout voltage $V_{UVLO}$, as indicated at position 325. The system current $I_{SYS}$ may increase, for instance, if there is increased processing demand in the device.

Because the system voltage $V_{SYS}$ drops below the system under-voltage lockout voltage $V_{UVLO}$ at location 325, the battery-powered device powers down. However, as shown at location 335, at the point of shut-down, the battery open circuit voltage OCV is significantly larger than the system under-voltage lockout voltage $V_{UVLO}$ and the battery state of charge remains much greater than 0%. The device could continue to operate with a lower system current $I_{SYS}$, and so the device shut-down is premature.

In some implementations, a battery-powered device employs a power management system such as system 100 in FIG. 1, which limits the system current $I_{SYS}$. Limiting the system current $I_{SYS}$ can prevent the system voltage $V_{SYS}$ from dropping below the system under-voltage lockout voltage $V_{UVLO}$ and thus prevent the device from powering down prematurely.

Figure 4:
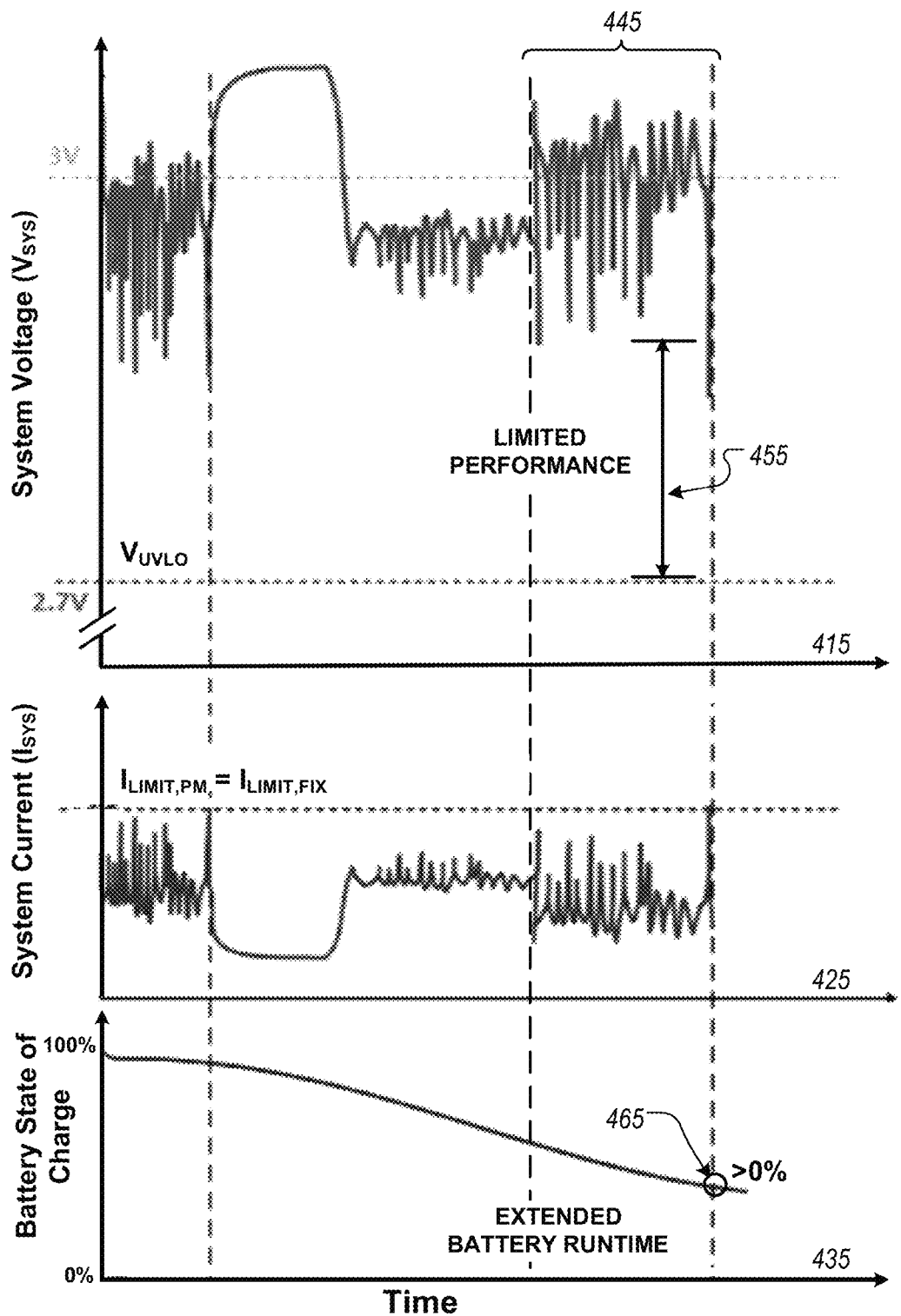
FIG. 4 is a set of charts that illustrate an example of device behavior when battery runtime is preferred.
Figure 5:
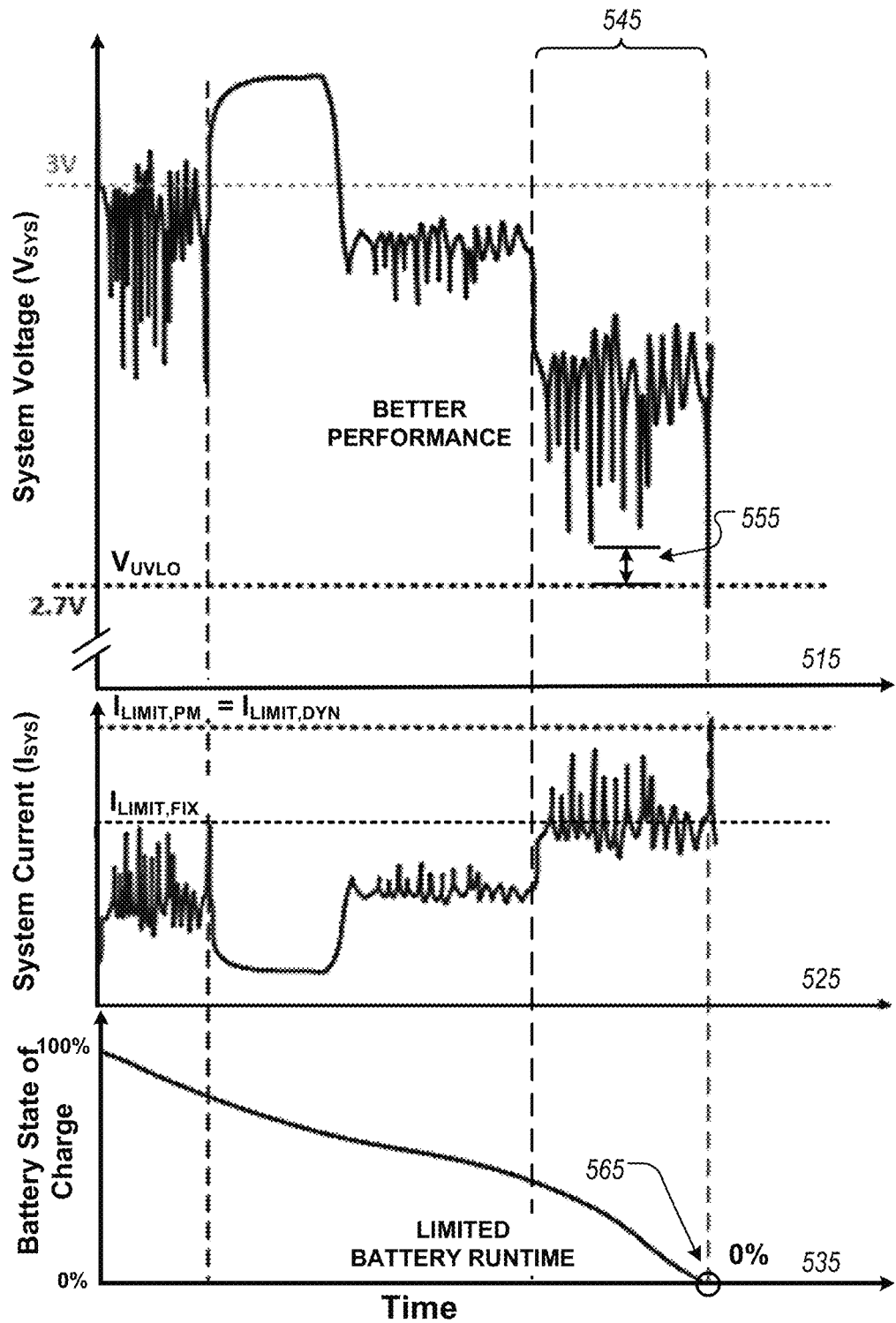
FIG. 5 is a set of charts that illustrate an example of device behavior when device performance is preferred.

FIGS. 4 and 5 illustrate examples that compare device behavior when battery runtime or device performance are preferred. FIG. 4 illustrates an example of device behavior where the device sets current limits to extend battery runtime, which also leads to limited device performance. FIG. 5 illustrates an example of device behavior where the device sets current limits to achieve better device performance, which also leads to limited battery runtime.

In both the examples of FIG. 4 and FIG. 5, the device sets a power management current limit $I_{LIMIT,PM}$ to prevent premature device shut-down. In the example of FIG. 4, battery runtime is preferred and so the power management current limit $I_{LIMIT,PM}$ is set to the fixed lower current limit $I_{LIMIT,FIX}$, which is a more restrictive current limit. In the example of FIG. 5, device performance is preferred and so the power management current limit $I_{LIMIT,PM}$ is set to the dynamic maximum current limit $I_{LIMIT,DYN}$, which is greater than the fixed lower current limit $I_{LIMIT,FIX}$ and is thus a less restrictive current limit.

The upper charts 415 and 515 of FIG. 4 and FIG. 5, respectively, plot the system voltage $V_{SYS}$ as a function of time during device operation. The system under-voltage lockout voltage $V_{UVLO}$, which determines when the device powers down, is indicated. If the system voltage $V_{SYS}$ drops below the system under-voltage lockout voltage $V_{UVLO}$, the device powers down.

The middle charts 425 and 525 of FIG. 4 and FIG. 5, respectively, plot the system current $I_{SYS}$ as a function of time during device operation. In both charts, the respective power management limit currents $I_{LIMIT,PM}$ are indicated. In chart 525 of FIG. 5, the fixed lower limit current $I_{LIMIT,FIX}$ is also shown for reference.

The lower charts 435 and 535 of FIG. 4 and FIG. 5, respectively, plot the battery state of charge as a function of time during device operation. In both examples, at the left side of the plot, the battery begins at 100% state of charge. The battery state of charge decreases as the device is operated.

In the example of FIG. 4, at the start of timeframe 445, the device limits the system current $I_{SYS}$ to the power management current limit $I_{LIMIT,PM}$, which is equal to the fixed lower current limit $I_{LIMIT,FIX}$. As shown in chart 425, during timeframe 445 the system current $I_{SYS}$ is maintained below the fixed lower current $I_{LIMIT,FIX}$.

As shown in chart 415, limiting the system current $I_{SYS}$ prevents the system voltage $V_{SYS}$ from dropping below the system under-voltage lockout voltage $V_{UVLO}$, which would cause device shut-down. In timeframe 445, the system voltage $V_{SYS}$ remains well above the system under-voltage lockout voltage $V_{UVLO}$, indicating that the system current $I_{SYS}$ has room to increase without causing the device to shut-down. The margin 455 between the system voltage $V_{SYS}$ and system the under-voltage lockout voltage $V_{UVLO}$ gives an indication of the extent to which the device performance is over-throttled (i.e. the device performance is limited more than necessary). In chart 415, the large extent of the margin 455 indicates that the device is significantly over-throttled and performance is limited.

As shown in chart 435, the more restrictive system current $I_{SYS}$ results in a small decrease in battery state of charge during timeframe 445, with significant charge remaining in the battery at the end of timeframe 445 (location 465). The significant charge remaining in the battery indicates that battery runtime is extended.

In contrast, in the example of FIG. 5, at the start of timeframe 545, the device limits the system current $I_{SYS}$ to the power management current limit $I_{LIMIT,PM}$ which is equal to the dynamic maximum current limit $I_{LIMIT,DYN}$. As shown in chart 525, during timeframe 545 the system current $I_{SYS}$ is maintained below the dynamic maximum current limit $I_{LIMIT,DYN}$.

As in chart 415, chart 515 shows that limiting the system current $I_{SYS}$ prevents the system voltage $V_{SYS}$ from dropping below the system under-voltage lockout voltage $V_{UVLO}$. In timeframe 545, the system voltage $V_{SYS}$ drops near to, but not below, the system under-voltage lockout voltage $V_{UVLO}$, indicating that the system current $I_{SYS}$ is near the maximum current level possible without inducing device shut-down. In chart 515, the small extent of margin 555 indicates that the device is minimally over-throttled, which results in better performance compared to the operation depicted in FIG. 4.

As shown in chart 535, the higher system current $I_{SYS}$ results in a significant decrease in battery state of charge during timeframe 545, with the battery being fully discharged (0% state of charge) at the end of the timeframe 555 (location 565). The full depletion of the battery during timeframe 555 indicates that the battery runtime is limited when compared to the operation depicted in FIG. 4.

In some implementations, a power management system such as system 100 in FIG. 1 determines a power management current limit $I_{LIMIT,PM}$ that can be selected to extend battery runtime, achieve better device performance, or trade-off between extending battery runtime and achieving better device performance. The power management current limit $I_{LIMIT,PM}$ may be determined without input from a user, or may vary based on a preference input by a user.

Figure 6:
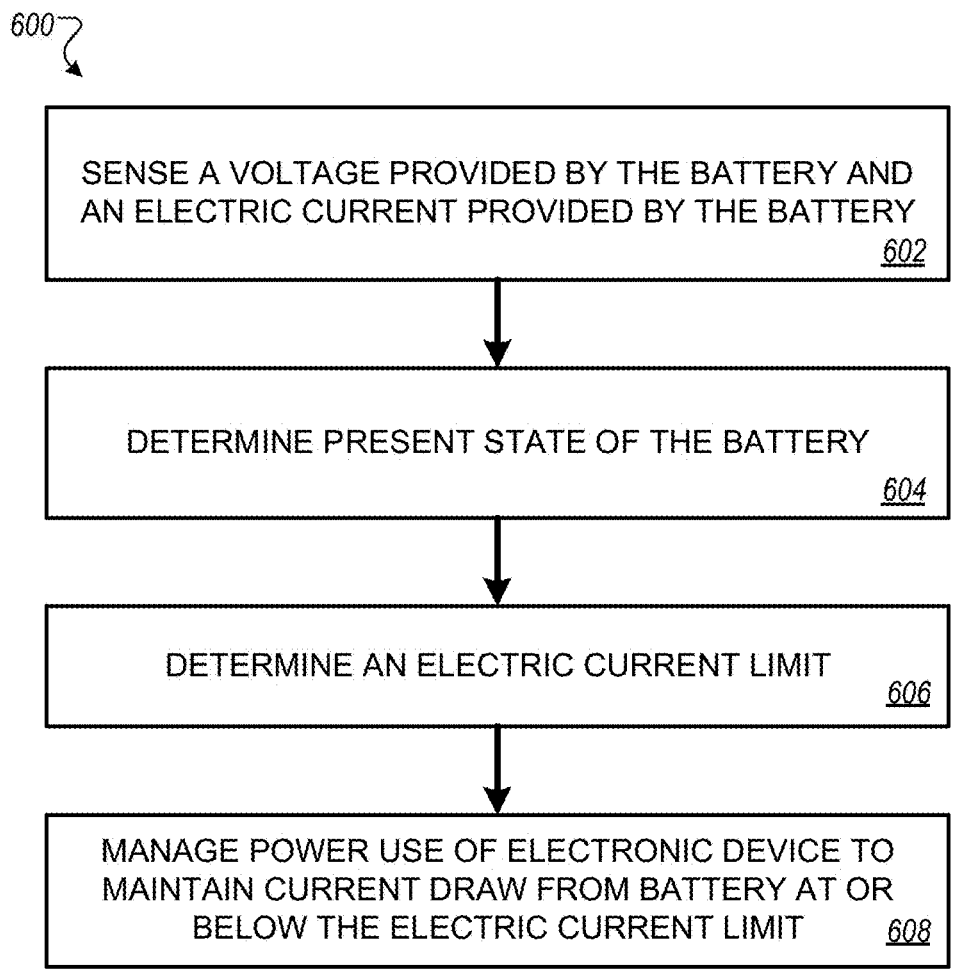
FIG. 6 is a flow chart that illustrates a process for dynamic battery power management.

FIG. 6 is a flow chart that illustrates a process 600 for dynamic battery power management. The process 600 can be performed by battery-powered electronic device, such as the device 110 of FIG. 1. The device includes at least a battery, one or more sensors, and a power management system. The one or more sensors may be configured to sense a voltage provided by the battery, an electric current provided by the battery, a battery temperature and/or a battery state of charge. The device may be, for instance, a mobile phone.

In process 600, the device senses a voltage provided by the battery and an electric current provided by the battery (602). For example, the device may sense the total voltage delivered to the device by the battery and the total current delivered to the device by the battery using the one or more sensors of the device.

The device determines the present state of the battery (604). For example, the device may determine the state of the battery by obtaining data indicating the open circuit voltage OCV of the battery. The device may also determine the state of the battery by obtain data indicating the sensed battery state of charge and sensed battery temperature, possibly from the output of a battery fuel gauge. Based on the battery state of charge and battery temperature, the device may determine a battery open circuit voltage OCV, for instance, by consulting a look-up table that associates a battery state of charge and battery temperature with a battery open circuit voltage OCV.

Based on the sensed voltage and current and the determined present state of the battery, the device determines an electric current limit (606). For example, the device may have a voltage threshold, where the device is configured to power down in response to detecting a voltage that is less than the voltage threshold. Based on the sensed voltage, the sensed electric current, and the determined state of the battery, the device may determine a maximum electric current threshold indicating an amount of electric current that the battery can provide without the voltage provided by the battery falling below the predetermined voltage threshold. The device may then determine the electric current limit to be the maximum electric current threshold.

The device may also determine a battery impedance based on the sensed voltage, sensed electric current, sensed battery temperature, and/or sensed battery state of charge. The device may determine the electric current for the device using the battery impedance.

The device may have a user interface configured to receive a user's input indicating the user's power management preference for the device. Based on the user's power management preference, the device may determine the electric current limit by selecting a current limit in a range from a minimum electric current threshold to a maximum electric current threshold, where the minimum and maximum electric current thresholds are determined by the device.

The device then manages power use of the electronic device to maintain current draw from the battery at or below the electric current limit (608). For example, the device can implement different power management settings for different device components to ensure that the total system current remains below the electric current limit. The device may implement different power-management settings for different electric current limits.

The device may periodically repeat the measurement cycle that includes sensing the voltage and electric current provided by the battery and determining the present state of the battery, then adjusts the electric current limit based on data obtained during the periodically repeated measurement cycles.

The process 600 may be performed using hardware, software, firmware, or a combination of them. In some implementations, one or more non-transitory machine-readable media store instructions directing the device to perform the process 600.

Embodiments of the invention and all of the functional operations described in this specification may be implemented in digital electronic circuitry, or in computer software, firmware, or hardware, including the structures disclosed in this specification and their structural equivalents, or in combinations of one or more of them. Embodiments of the invention may be implemented as one or more computer program products, i.e., one or more modules of computer program instructions encoded on a computer-readable medium for execution by, or to control the operation of, data processing apparatus. The computer readable medium may be a non-transitory computer readable storage medium, a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a stand-alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media, and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

To provide for interaction with a user, embodiments of the invention may be implemented on a computer having a display device, e.g., a CRT (cathode ray tube) or LCD (liquid crystal display) display, for displaying information to the user and touchscreen, buttons, a keyboard, or other input device by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments of the invention may be implemented in a computing system that includes a back end component, e.g., as a data server, or that includes a middleware component, e.g., an application server, or that includes a front end component, e.g., a client computer having a graphical user interface or a Web browser through which a user may interact with an implementation of the invention, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments of the invention have been described. Other embodiments are within the scope of the following claims. For example, the actions recited in the claims may be performed in a different order and still achieve desirable results.

What is claimed is:

1. A method comprising:
   providing, by a battery-powered device, a user interface configured to receive user input indicating a power management preference for the battery-powered device;
   receiving, by the battery-powered device, user input to the user interface that indicates a power management preference for the battery-powered device;
   in response to receiving the user input, adjusting, by the battery-powered device, an electric current limit for current drawn from a battery of the battery-powered device, wherein the electric current limit is set based on (i) the indicated power management preference and (ii) a variable maximum electric current limit that is determined, based on a current state of the battery, to represent an amount of electric current that the battery can provide without a voltage provided by the battery falling below a predetermined voltage threshold; and
   managing, by the battery-powered device, operation of the battery-powered device such that current drawn from the battery does not exceed the electric current limit.

2. The method of claim 1, wherein providing the user interface comprises providing a user interface providing one or more controls to adjust a tradeoff between battery runtime and device performance.

3. The method of claim 1, wherein the user interface comprises one or more controls configured to set a power management preference at any of multiple values along a range, wherein each of the multiple values corresponds to a different electric current limit for the battery-powered device.

4. The method of claim 1, wherein adjusting the electric current limit for the battery-powered device comprises setting the electric current limit based on a fixed electric current limit for current from the battery of the battery-powered device.

5. The method of claim 1, wherein the variable maximum electric current limit is determined by the battery-powered device based on a measure of an open circuit impedance of the battery.

6. The method of claim 1, wherein adjusting an electric current limit for the battery-powered device comprises adjusting the electric current limit to a value in a range that extends from a fixed electric current limit to the variable maximum electric current limit, determined based on a current state of the battery of the battery-powered device, that is higher than the fixed electric current limit.

7. The method of claim 1, wherein the user input indicates a value along a range; and
   wherein adjusting the electric current limit comprises setting an electric current limit, based on the value along the range, that is an intermediate position between a predetermined lower current limit and the variable maximum electric current limit.

8. The method of claim 1 comprising:
   monitoring parameters of the battery of the battery-powered device; and
   automatically adjusting the electric current limit in response to detecting a change in the parameters of the battery.

9. The method of claim 1, wherein the battery-powered device is a cellular phone.

10. The method of claim 1, wherein the electric current limit is a limit on total current drawn from the battery by the battery-powered device; and
    wherein managing the operation of the battery-powered device comprises managing the operation of the battery powered device such that total current drawn from the battery does not exceed the electric current limit.

11. The method of claim 1, wherein the electric current limit is a limit on system current drawn from the battery by the battery-powered device and consumed by the battery-powered device; and
    wherein managing the operation of the battery-powered device comprises managing the operation of the battery powered device such that the system current drawn from the battery and consumed by the battery-powered device does not exceed the electric current limit.

12. The method of claim 1, wherein the electric current limit is set, based on the indicated power management preference, to a value having a particular relationship with respect to a range from a predetermined lower electric current limit to the variable maximum electric current limit;
    wherein the method includes:
        changing the variable current limit is response to a change in a state of the battery to alter the range from the predetermined lower current limit to the variable maximum current limit; and
        updating the electric current limit to set the electric current limit to a value having the particular relationship with respect to the altered range.

13. The method of claim 1, further comprising:
    sensing, using one or more sensors, a voltage provided by the battery and an electric current provided by the battery; and
    determining a present state of the battery;
    wherein adjusting the electric current limit comprises determining the electric current limit, using a power management system of the battery-powered device, by:
        determining a first electric current threshold for the battery-powered device;
        determining the variable maximum electric current limit based on the sensed voltage, the sensed electric current, and the determined state of the battery, the maximum electric current threshold being greater than the first electric current threshold; and
        selecting, as the electric current limit for the battery-powered device, an electric current limit that is (i) greater than the first electric current threshold and (ii) less than the maximum electric current threshold, wherein the electric current limit is selected based on the power management preference indicated by the user input received using the user interface; and
    wherein managing the operation of the battery-powered device comprises initiating a reduction in power use of the battery-powered device to maintain electric current draw from the battery at or below the electric current limit.

14. A battery-powered device comprising:
    a display;
    a battery; and
    one or more processors and one or more machine-readable media storing instructions that, when executed by the one or more processors, cause the battery-powered device to perform operations comprising:
        providing, on the display, a user interface configured to receive user input indicating a power management preference for the battery-powered device;

receiving, by the battery-powered device, user input to the user interface that indicates a power management preference for the battery-powered device;

in response to receiving the user input, adjusting, by the battery-powered device, an electric current limit for current drawn from a battery of the battery-powered device, wherein the electric current limit is set based on (i) the indicated power management preference and (ii) a variable maximum electric current limit that is determined, based on a current state of the battery, to represent an amount of electric current that the battery can provide without a voltage provided by the battery falling below a predetermined voltage threshold; and managing, by the battery-powered device, operation of the battery-powered device such that current drawn from the battery does not exceed the electric current limit.

15. The device of claim 14, wherein providing the user interface comprises providing a user interface providing one or more controls to adjust a tradeoff between battery runtime and device performance.

16. The device of claim 14, wherein the user interface comprises one or more controls configured to set a power management preference at any of multiple values along a range, wherein each of the multiple values corresponds to a different electric current limit for the battery-powered device.

17. The battery-powered device of claim 14, further comprising:

one or more sensors configured to sense a voltage provided by the battery and an electric current provided by the battery; and a power management system configured to:
sense, using the one or more sensors, a voltage provided by the battery and an electric current provided by the battery;
determine a present state of the battery; and
determine the electric current limit for the battery powered device based on the sensed voltage, the sensed electric current, and the determined present state of the battery, and the power management preference indicated by the user input received using the user interface;

wherein managing the operation of the battery-powered device comprises initiating a reduction in power use of the battery-powered device to maintain electric current draw from the battery at or below the electric current limit; and wherein the power management system is configured to determine the electric current limit for the battery-powered device by:
determining a first electric current threshold for the battery-powered device;
determining the variable maximum electric current limit based on the sensed voltage, the sensed electric current, and the determined state of the battery, the maximum electric current threshold being greater than the first electric current threshold; and
selecting, as the electric current limit for the battery-powered device, an electric current limit that is (i) greater than the first electric current threshold and (ii) less than the maximum electric current threshold, wherein the electric current limit is selected based on the power management preference indicated by the user input received using the user interface.

18. One or more non-transitory machine-readable media storing instructions that, when executed by one or more processors of a battery- powered device, cause the battery-powered device to perform operations comprising:

providing, by the battery-powered device, a user interface configured to receive user input indicating a power management preference for the battery-powered device;

receiving, by the battery-powered device, user input to the user interface that indicates a power management preference for the battery-powered device;

in response to receiving the user input, adjusting, by the battery-powered device, an electric current limit for current drawn from a battery of the battery-powered device, wherein the electric current limit is set based on (i) the indicated power management preference and (ii) a variable maximum electric current limit that is determined, based on a current state of the battery, to represent an amount of electric current that the battery can provide without a voltage provided by the battery falling below a predetermined voltage threshold; and managing, by the battery-powered device, operation of the battery-powered device such that current drawn from the battery does not exceed the electric current limit.

19. The one or more non-transitory machine-readable media of claim 18, wherein the user interface comprises one or more controls configured to set a power management preference at any of multiple values along a range, wherein each of the multiple values corresponds to a different electric current limit for the battery-powered device.

20. The one or more non-transitory machine-readable media of claim 18, wherein the operations further comprise:

sensing, using one or more sensors, a voltage provided by the battery and an electric current provided by the battery; and determining a present state of the battery;

wherein adjusting the electric current limit comprises determining the electric current limit, using a power management system of the battery-powered device, by:
determining a first electric current threshold for the battery-powered device;
determining the variable maximum electric current limit based on the sensed voltage, the sensed electric current, and the determined state of the battery, the maximum electric current threshold being greater than the first electric current threshold; and
selecting, as the electric current limit for the battery-powered device, an electric current limit that is (i) greater than the first electric current threshold and (ii) less than the maximum electric current threshold, wherein the electric current limit is selected based on the power management preference indicated by the user input received using the user interface; and wherein managing the operation of the battery-powered device comprises initiating a reduction in power use of the battery-powered device to maintain electric current draw from the battery at or below the electric current limit.

\* \* \* \* \*